(12) United States Patent
Yoon et al.

(10) Patent No.: US 8,614,458 B2
(45) Date of Patent: Dec. 24, 2013

(54) PATTERNED SUBSTRATE FOR LIGHT EMITTING DIODE AND LIGHT EMITTING DIODE EMPLOYING THE SAME

(75) Inventors: Yeo Jin Yoon, Ansan-si (KR); Won Cheol Seo, Anyang-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 417 days.

(21) Appl. No.: 12/090,050

(22) PCT Filed: Nov. 28, 2006

(86) PCT No.: PCT/KR2006/005061
§ 371 (c)(1),
(2), (4) Date: May 8, 2008

(87) PCT Pub. No.: WO2007/091762
PCT Pub. Date: Aug. 16, 2007

(65) Prior Publication Data
US 2008/0230793 A1  Sep. 25, 2008

(30) Foreign Application Priority Data
Feb. 9, 2006  (KR) .................. 10-2006-0012433

(51) Int. Cl.
*H01L 33/00* (2010.01)
(52) U.S. Cl.
USPC ................................ 257/103; 257/79; 257/94
(58) Field of Classification Search
USPC .......................... 257/103, 79, 94, 12
See application file for complete search history.

(56) References Cited

U.S. PATENT DOCUMENTS 6,720,586 B1 *  4/2004  Kidoguchi et al. ............ 257/103
7,579,627 B2 *  8/2009  Ueta et al. ........................ 257/79

FOREIGN PATENT DOCUMENTS

| JP | 11-274568 | 10/1999 |
| JP | 2003-318441 | 11/2003 |
| JP | 2004-153089 | 5/2004 |
| JP | 2005-183905 | 7/2005 |
| KR | 10-2003-0093265 | 12/2003 |
| KR | 10-2005-0062832 | 6/2005 |
| KR | 10-2005-0096509 | 10/2005 |
| KR | 10-2005-0097075 | 10/2005 |
| WO | 2004-023568 | 3/2004 |

OTHER PUBLICATIONS

Motokazu Yamada, et al., "InGaN-Based Near-Ultraviolet and Blue-Light-Emitting Diodes with High External Quantum Efficiency Using a Patterned Sapphire Substrate and a Mesh Electrode", Japanese Journal of Applied Physics, vol. 41 Part 2 (2002), No. 12B, pp. L1431-L1433.

\* cited by examiner

*Primary Examiner* — Harold Weiss
*Assistant Examiner* — Steven Rao
(74) *Attorney, Agent, or Firm* — H.C. Park & Associates, PLC

(57) ABSTRACT

Disclosed herein are a patterned substrate for a light emitting diode and a light emitting diode employing the patterned substrate. The substrate has top and bottom surfaces. Protrusion patterns are arranged on the top surface of the substrate. Furthermore, recessed regions surround the protrusion patterns. The recessed regions have irregular bottoms. Thus, the protrusion patterns and the recessed regions can prevent light emitted from a light emitting diode from being lost due to the total reflection to thereby improve light extraction efficiency.

19 Claims, 3 Drawing Sheets

(a)

(b)

PATTERNED SUBSTRATE FOR LIGHT EMITTING DIODE AND LIGHT EMITTING DIODE EMPLOYING THE SAME

CROSS REFERENCE RELATED APPLICATIONS

This application is the National Stage of International Application No. PCT/KR2006/005061, filed on Nov. 28, 2006, and claims priority from and the benefit of Korean Patent Application No. 10-2006-0012433, filed on Feb. 9, 2006, which are both hereby incorporated by reference for all purposes as if fully set forth herein.

BACKGROUND OF THE INVENTION

1. Field of the Invention

The present invention relates to a substrate for a light emitting diode and a light emitting diode employing the same. More specifically, the present invention relates to a patterned substrate for a light emitting diode and a light emitting diode employing the same.

2. Discussion of the Background

GaN-based light emitting diodes (LEDs) have been developed and applied for about 10 years. The GaN-based LEDs have significantly changed LED technologies and currently employed in a variety of applications including full color LED displays, LED traffic lights, white LEDs and the like.

Recently, high-efficiency white LEDs have been expected to replace common fluorescent lamps. Particularly, the efficiency of white LED is approaching that of general fluorescent lamps. However, there is room for further improvement in the efficiency of LEDs, and thus, further efficiency improvement is continuously required.

Two major approaches have been attempted to improve the efficiency of LEDs. The first approach is to enhance the internal quantum efficiency determined by the crystal quality and the epitaxial layer structure, and the second approach is to increase the light extraction efficiency.

Since the internal quantum efficiency currently reaches 70~80%, there is little room for further improvement of the internal quantum efficiency. However, there is room for improvement in the light extraction efficiency. For the improvement in light extraction efficiency, it is important to eliminate internal loss by employing a heat radiation structure and roughened surfaces.

Meanwhile, roughened surfaces are employed to prevent total reflection due to a difference between refractive indexes of a GaN-based LED and the surrounding thereof, e.g. a substrate and the atmosphere. Since a GaN-based semiconductor material has a high refractive index of about 2.4, a critical angle is relatively large. Light directed toward a surface of an LED at an angle less than a critical angle is totally reflected and then returned again to the interior of the LED. Such light may be again reflected and then radiated to the outside, but a portion of the light is absorbed into the LED or electrodes and then lost in the form of heat. The roughened surfaces prevent light incident on the LED surface from being returned to the interior of the LED due to the total reflection, and thus, allow the light to be radiated to the outside.

Meanwhile, a technology for employing a patterned sapphire substrate to improve light extraction efficiency has been proposed in "InGaN-based near-ultraviolet and blue-light-emitting diodes with high external quantum efficiency using a patterned sapphire substrate and a mesh electrode," Japanese Journal of Applied Physics, Vol. 41, 2002, pp. L1431-L143, Dec. 15, 2002.

According to the technical paper, a sapphire substrate is etched to form convex hexagons thereon such that light loss due to total reflection of light between an LED and a substrate can be reduced to thereby improve light extraction efficiency.

However, the light extraction efficiency of LEDs has not yet reached a satisfactory level, and thus, continuous efforts to improve the light extraction efficiency are required.

SUMMARY OF THE INVENTION

An object of the present invention is to provide a patterned substrate for a light emitting diode capable of further improving light extraction efficiency.

Another object of the present invention is to provide a light emitting diode employing a patterned substrate capable of further improving light extraction efficiency.

To achieve the objects of the present invention, there is provided a patterned substrate for a light emitting diode and a light emitting diode employing the patterned substrate. The substrate for a light emitting diode according to an aspect of the present invention has top and bottom surfaces. Protrusion patterns are arranged on the top surface of the substrate. Furthermore, recessed regions surround the protrusion patterns. The recessed regions have irregular bottoms. Therefore, since light emitted from a light emitting diode can be irregularly scattered by the protrusion patterns and the recessed regions, light loss due to the total reflection can be reduced and light extraction efficiency can also be improved.

The substrate may be a sapphire substrate. Since sapphire has a refractive index of about 1.7, the sapphire substrate has a critical angle larger than that of a SiC or GaN substrate and light loss due to the total reflection is also relatively large. Therefore, the light loss can be greatly reduced by the protrusion patterns and the recessed regions.

In addition, the bottom surface may be a flat surface. That is, the bottom surface is not patterned. Therefore, the total reflection occurs well on the bottom surface and the totally reflected light is returned toward the light emitting diode and then emitted to the top of the diode. Therefore, light emitted outward through the bottom surface of the substrate is reduced and thus light extraction efficiency can be further improved.

The recessed regions surrounding each of the protrusion patterns may be symmetrical with respect to the relevant protrusion pattern. Further, the protrusion patterns may have a variety of sections, e.g. a triangle, a rectangle, a pentagon, a hexagon and the like. A top surface of the protrusion pattern may be convex upward.

Sidewalls of the recessed regions may be formed into inclined surfaces. The inclined surfaces are formed in such a manner that the width of the protrusion pattern is increased downward. Therefore, light incident on the inclined surfaces is generally incident to the substrate.

A light emitting diode employing a patterned substrate according to another aspect of the present invention comprises a substrate with top and bottom surfaces. Protrusion patterns are arranged on the top surface of the substrate. Further, recessed regions surround the protrusion patterns. The recessed regions have irregular bottoms. Furthermore, a first conductive type semiconductor layer is formed on the top surface of the substrate. Further, a second conductive type semiconductor layer is formed on a region of the first conductive type semiconductor layer, and an active layer is interposed between the first and second conductive type semiconductor layers. Therefore, there is provided a light emitting diode whose light extraction efficiency is improved by means of the protrusion patterns and the recessed regions.

A buffer layer may also be interposed between the substrate and the first conductive type semiconductor layer. The buffer layer can reduce lattice mismatch between the first conductive type semiconductor layer and the substrate.

According to a further aspect of the present invention, there is provided a method of manufacturing a patterned substrate for a light emitting diode. The manufacturing method of the present invention comprises the step of preparing a substrate with flat top and bottom surfaces. A first mask pattern is formed on the top surface of the substrate to define first recessed regions. Subsequently, the substrate is partially etched using the first mask pattern as an etching mask to form the first recessed regions and the remaining first mask pattern is then removed. A second mask pattern is also formed on the top surface of the substrate to define second recessed regions. The second recessed regions are formed to partially overlap the first recessed regions. Subsequently, the substrate is partially etched using the second mask pattern as an etching mask to form the second recessed regions. Accordingly, a patterned substrate for a light emitting diode with protrusion patterns and recessed regions are manufactured.

The first mask pattern may include lines parallel to each other. Further, the second mask pattern may include lines which intersect the parallel lines of the first mask pattern. Therefore, the protrusion patterns each of which has a rectangular section are formed, and thus, the recessed regions surrounding the protrusion patterns are formed.

Sidewalls of the first and second recessed regions may be formed into inclined surfaces. The inclined surfaces may be formed by causing the first and second mask patterns to be inclined.

A buffer layer, a first conductive type semiconductor layer, an active layer and a second conductive type semiconductor layer may be formed on the substrate. Subsequently, the second conductive type semiconductor layer and the active layer are etched to expose a region of the first conductive type semiconductor layer. Accordingly, there is provided a light emitting diode formed on the patterned substrate.

According to embodiments of the present invention, there is provided a patterned substrate for a light emitting diode wherein protrusion patterns and irregular recessed regions can be formed on a top surface of the patterned substrate to improve light extraction efficiency. In addition, there is provided a light emitting diode wherein the substrate is employed to further improve light extraction efficiency.

DETAILED DESCRIPTION OF THE ILLUSTRATED EMBODIMENTS

Figure 1:
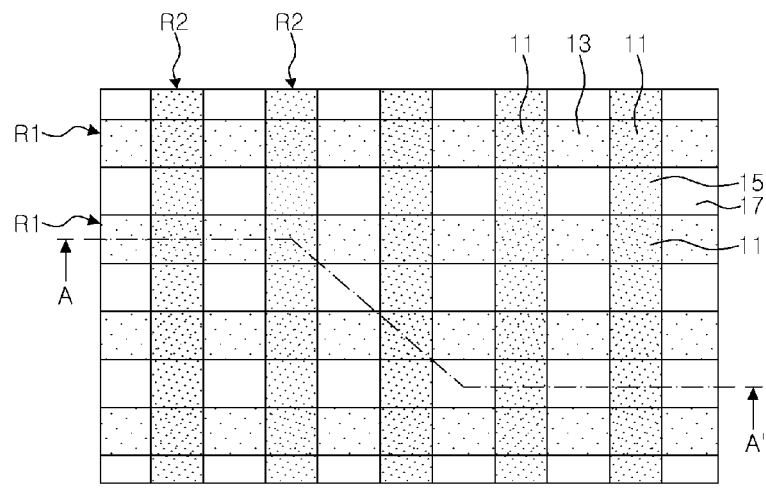
FIG. 1 is a plan view of a patterned substrate for a light emitting diode according to an embodiment of the present invention.

Hereinafter, preferred embodiments of the present invention will be described in detail with reference to the accompanying drawings. The following embodiments are provided only for illustrative purpose to fully convey the spirit of the present invention to those skilled in the art. Thus, the present invention is not limited to the embodiments which will be described below, but may be implemented in other forms. In the drawings, the width, length, thickness, etc. of components may be exaggerated for the sake of convenience. Throughout the descriptions, like reference numerals designate like elements.

Figure 2:
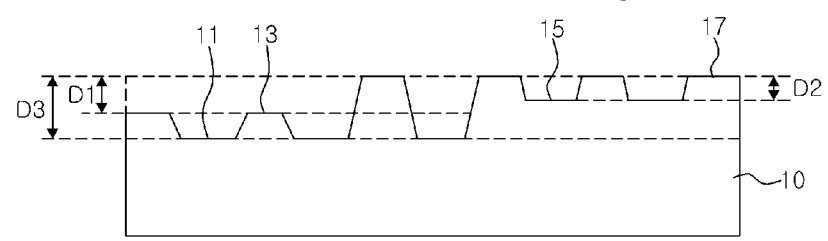
FIG. 2 is a sectional view taken along line A-A' in FIG. 1.

FIG. 1 is a plan view illustrating a patterned substrate 10 for a light emitting diode (LED) according to an embodiment of the present invention, and FIG. 2 is a sectional view taken along line A-A' in FIG. 1.

Referring to FIGS. 1 and 2, the substrate 10 has bottom and top surfaces. Protrusion patterns 17 are arranged on the top surface of the substrate 10. The protrusion patterns 17 are arranged in a two-dimensional way and may be arranged in a matrix form as shown in FIG. 1. However, the present invention is not limited thereto but the patterns may be arranged in various shapes including a honeycomb shape. Although it is illustrated that the protrusion patterns 17 are formed into a rectangular shape, they are not limited thereto but may have various shapes including a triangle, a pentagon and a hexagon other than a rectangle. Further, although a top surface of each of the protrusion patterns 17 may be a flat surface, it is not limited thereto but may be a convex surface.

Each of the protrusion patterns 17 is surrounded by first and second recessed regions R1 and R2. The first and second recessed regions R1 and R2 surrounding each of the protrusion patterns 17 can be symmetrical with respect to the relevant protrusion pattern 17, respectively. Further, the first and second recessed regions R1 and R2 may have the same shape as each other.

Meanwhile, the first and second recessed regions R1 and R2 partially overlap each other. A region 11 where the recessed regions overlap each other has the bottom deeper than the other regions. Therefore, the first and second recessed regions R1 and R2 have the bottoms with irregular depths.

That is, as shown in FIG. 2, a depth D3 from the top surface of the protrusion pattern 17 to the regions 11 (concave portions) where the first and second recessed regions overlap each other is greater than depths D1 and D2 from the top surface of the protrusion pattern 17 to convex portions 13 and 15 in the first and second recessed regions, respectively. Further, the depths D1 and D2 may be identical to each other, or they may be different from each other as shown in the figure.

Sidewalls of each recessed region R1 or R2 define inclined surfaces. Each of the inclined surfaces may have a constant slope, but it is not limited thereto, and the curvature of the slope may vary.

According to this embodiment, there is provided a substrate having the protrusion patterns 17 and the recessed regions with irregular bottoms. Therefore, light incident on a top surface of the substrate 10 irregularly changes its traveling path, and thus, light loss due to the total reflection can be reduced. Particularly, according to this embodiment, since irregular bottom surfaces are formed in the recessed regions R1 and R2, the top surface of the substrate 10 has surfaces with various heights and inclined surfaces. Therefore, since the substrate of the present invention can change a path of light more irregularly as compared with a conventional patterned sapphire substrate, light loss due to the total reflection can be further reduced.

Figure 3:
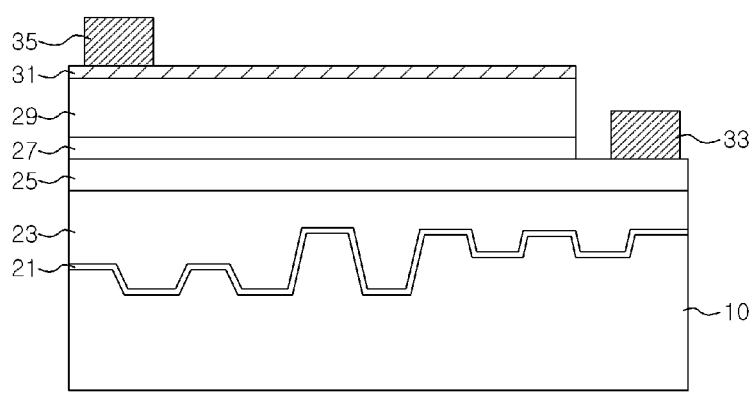
FIG. 3 is a sectional view of a light emitting diode employing the patterned substrate according to an embodiment of the present invention.

FIG. 3 is a sectional view illustrating a light emitting diode employing the patterned substrate 10 according to the embodiment of the present invention.

Referring to FIG. 3, a first conductive type semiconductor layer 25, an active layer 27 and a second conductive type semiconductor layer 29 are positioned on the substrate 10 as described referring to FIGS. 1 and 2. A region of the first conductive type semiconductor layer 25 is exposed to the outside. Furthermore, a buffer layer 21 may be interposed between the first conductive type semiconductor layer 25 and the substrate 10. The buffer layer 21 is used to reduce lattice mismatch between the first conductive type semiconductor layer 25 and the substrate 10. In addition, an undoped semiconductor layer 23 may be further interposed on the buffer layer 21.

The first and second conductive type semiconductor layers are of N-type and P-type, or P-type and N-type, respectively. Each of the first and second conductive type semiconductor layers may be formed of an (Al, In, Ga)N compound semiconductor. N-type and P-type semiconductor layers may be doped with Si and Mg, respectively. The active layer 27 may also formed of an (Al, In, Ga)N compound semiconductor, and formed into a single or multiple quantum well structure.

Meanwhile, an electrode pad 33 may be formed on the exposed region of the first conducive semiconductor layer 25, and an electrode 31 and an electrode pad 35 may also be formed on the second conductive type semiconductor layer 29. The electrode 31 may be formed into a mesh shape. However, the electrode is not limited thereto and may be formed into a conductive layer of ITO or Ni/Au.

According to this embodiment, light emitted from the active layer 27 is transmitted through the electrode 31 and then radiated to the outside. Further, light emitted toward the substrate 10 is not totally reflected regularly on the top surface of the substrate 10 but irregularly changes its traveling path such that it is emitted to a side of the substrate or returned toward the active layer 27. The light returned toward the active layer 27 changes its traveling path and is thus easily emitted to the outside. Therefore, the light loss in electrode or semiconductor layers due to repetition of the total reflection can be reduced to thereby improve the light extraction efficiency.

Figure 4:
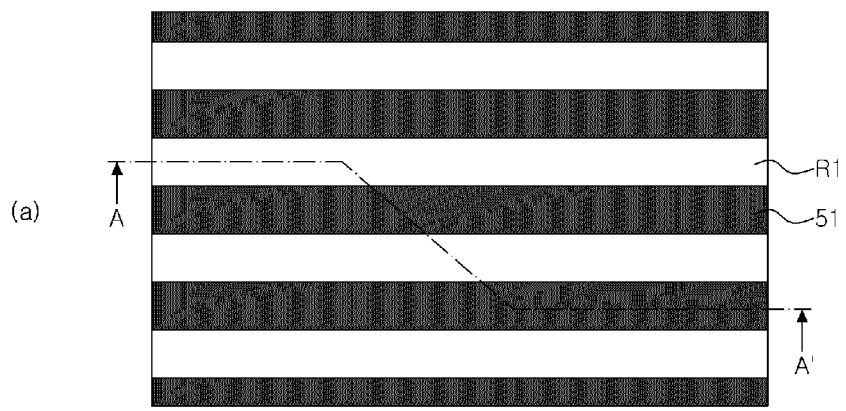
FIGS. 4 to 6 are plan and sectional views illustrating a method of manufacturing a patterned substrate for a light emitting diode according to an embodiment of the present invention.
Figure 5:
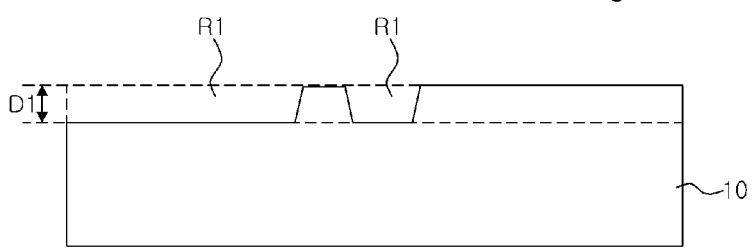
Figure 6:
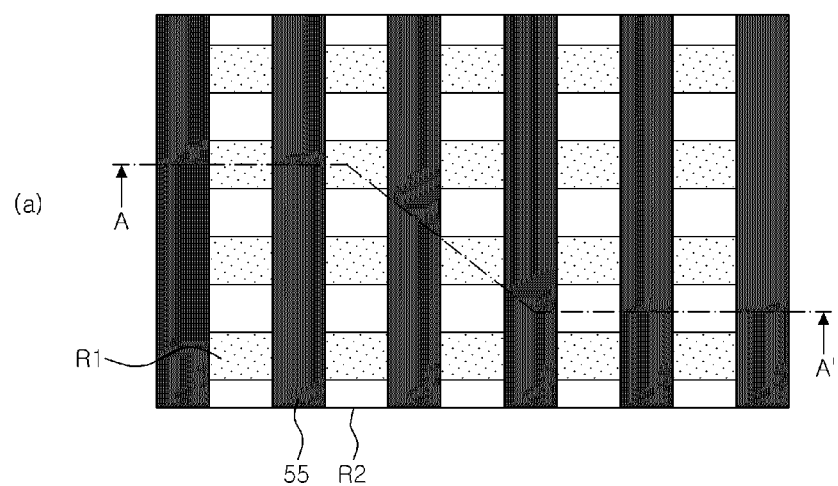
Figure 6:
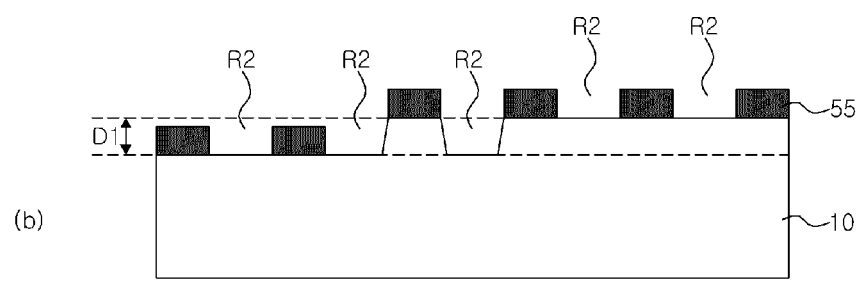

FIGS. 4 to 6 are plan and sectional views illustrating a method of manufacturing a patterned substrate for a light emitting diode according to an embodiment of the present invention. Here, FIGS. 4a and 6a are plan views and FIGS. 4b and 6b are sectional views taken along line A-A' in FIGS. 4a and 6a, respectively.

Referring to FIGS. 4a and 4b, a first mask pattern 51 defining first recessed regions R1 is formed on a substrate 10 having top and bottom surfaces. The substrate 10 may be a sapphire, SiC or GaN substrate.

The first mask pattern 51 may be a photoresist pattern. However, it is not limited thereto but may be a pattern of a dielectric layer made of silicon oxide (SiO2). The photoresist pattern may be obtained by forming a photoresist layer and then performing photolithography and development processes on the photoresist layer. At this time, the developed photoresist layer may be subjected to a reflowing process such that its top surface has a width greater than that of its bottom surface. The reflowing process may be performed by heating the substrate 10 at a temperature of 100 to 150°C.

Meanwhile, the mask pattern using a dielectric layer may be obtained by forming a dielectric layer on the substrate 10 and then patterning it using photolithography and etching processes. In this case, sidewalls of the mask pattern may be formed into inclined surfaces.

As shown in the figures, the first mask pattern 51 can include parallel lines. Therefore, the parallel recessed regions R1 are defined.

Subsequently, the first recessed regions R1 are formed by partially etching the substrate 10 using the first mask pattern 51 as an etching mask. At this time, an etched depth of the substrate 10 may be the depth D1 which is roughly equal to the convex portions 13 of FIG. 2.

Referring to FIG. 5, after the etching process has been completed, the remaining first mask pattern 51 is removed. The first mask pattern 51 can be removed using an ashing or etching process.

Referring to FIGS. 6a and 6b, a second mask pattern 55 defining second recessed regions R2 is formed on the substrate 10 with the first recessed regions R1 formed therein. At this time, the second recessed regions R2 partially overlap the first recessed regions R1. That is, the second recessed regions intersect the first recessed regions R1. In a case where the first mask pattern 51 includes parallel lines, the second mask pattern 55 may include lines intersecting the parallel lines of the first mask pattern 51. The second mask pattern 55 may be formed perpendicular to the first mask pattern 51, but the present invention is not limited thereto. Furthermore, the second mask pattern 55 may be a photoresist pattern or a pattern of a dielectric layer as described above.

Subsequently, the substrate 10 is partially etched again using the second mask pattern 55 as an etching mask. As a result, the second recessed regions R2 are formed. At this time, the etched depth of the substrate 10 may be the depth D2 which is roughly equal to the convex portions 15 of FIG. 2. Since the second recessed regions R2 partially overlap the first recessed regions R1, the overlapped regions are repeatedly etched and are thus etched in the depth D3 corresponding to the sum of the depths D1 and D2. As a result, the substrate 10 illustrated in FIGS. 1 and 2 has been completed.

According to this embodiment, the substrate 10 with the protrusion patterns 17 and the recessed regions R1 and R2 formed on the top surface thereof is manufactured. The recessed regions R1 and R2 have irregular bottoms. Further, the first and second recessed regions R1 and R2 are etched to the different depths D1 and D2, and thus, the convex portions 13 and 15 in the recessed regions can have different heights.

Although it has been illustrated in this embodiment that the substrate etching processes are performed twice, the present invention is not limited thereto. That is, the substrate etching processes may be performed more times. Further, the first and/or second mask patterns may be formed into various shapes in addition to the line patterns. Therefore, recessed regions having irregularities with various depths can be formed, and thus, a variety of protrusion patterns can be formed.

A light emitting diode can be fabricated by forming semiconductor layers on the substrate 10 according to this embodiment. Hereinafter, a method of fabricating a light emitting diode by employing the substrate 10 will be described.

Referring back to FIG. 3, a first conductive type semiconductor layer 25, an active layer 27 and a second conductive type semiconductor layer 29 are formed on the substrate 10 having the protrusion patterns 17 and the recessed regions R1 and R2. Before the first conductive type semiconductor layer 25 is formed, a buffer layer 21 may be formed. Furthermore, an undoped semiconductor layer 23 may also be formed.

Each of the above semiconductor layers may be formed using a metalorganic chemical vapor deposition (MOCVD) technique, a hydride vapor phase epitaxy (HVPE) technique, a molecular beam epitaxy (MBE) technique, and the like.

The second conductive type semiconductor layer 29 and the active layer 27 are patterned such that one region of the first conductive type semiconductor layer 25 can be exposed to the outside. Such a patterning process is performed using photolithography and etching processes. Then, the electrode 31 is formed on the second conductive type semiconductor layer 29, and the electrode pads 35 and 33 are formed on the electrode 31 and the first conductive type semiconductor layer 25, respectively. The electrode 31 and the electrode pads 33 and 35 may be formed using a lift-off technique.

As described above, the electrode 31 may be formed after the region of the first conductive type semiconductor layer 25 has been exposed. However, the electrode may be formed by forming an electrode layer using an e-beam evaporation technique and then patterning the formed electrode layer using photolithography and etching processes before the first conductive type semiconductor layer 25 is exposed.

Figure 7:
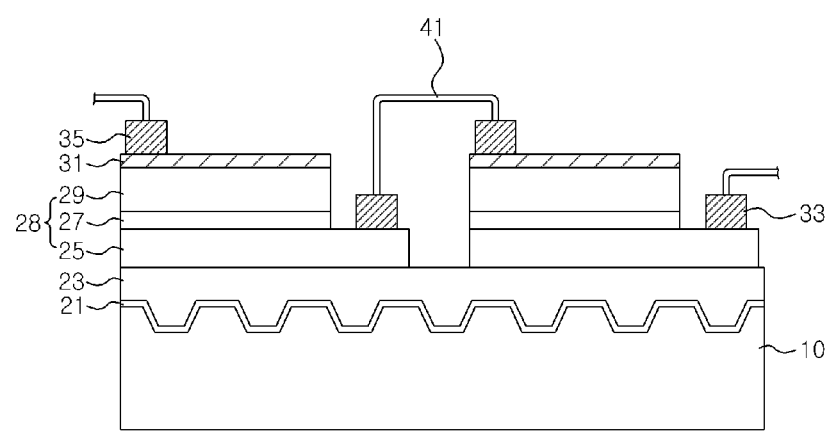
FIG. 7 is a sectional view of a light emitting diode employing a patterned substrate according to another embodiment of the present invention.

FIG. 7 is a sectional view illustrating a light emitting diode employing a patterned substrate 10 according to another embodiment of the present invention.

Referring to FIG. 7, a plurality of light emitting cells 28 are formed on the patterned substrate 10. The substrate 10 is the same as the substrate described referring to FIGS. 1 and 2. The substrate also has the protrusion patterns 17 and the recessed regions R1 and R2.

As described in FIG. 3, each of the plurality of light emitting cells 28 comprises a first conductive type semiconductor layer 25, a second conductive type semiconductor layer 29 formed on a region of the first conductive type semiconductor layer 25, and an active layer 27 interposed between the first and second conductive type semiconductor layers. Here, the first conductive type semiconductor layers 25 of the plurality of light emitting cells 28 are spaced apart from one another. The plurality of light emitting cells 28 are electrically connected to one another through wirings 41 to form arrays connected in series. The wirings 41 may be formed using an air-bridge or step-cover process.

Accordingly, there is provided a light emitting diode which can be connected directly to and driven by an AC power source. An example of a light emitting diode that can be connected directly to and driven by an AC power source has been proposed in International Publication No. WO 2004/023568 A1 entitled "Light-emitting device having light-emitting elements" by Sakai, et al. Descriptions on the operation of the light emitting diode will be omitted herein.

The invention claimed is:

1. A patterned substrate for a light emitting diode, comprising:
   a top surface;
   a bottom surface;
   protrusion patterns arranged in the top surface; and
   recessed regions surrounding the protrusion patterns and having irregular bottoms in the top surface,
   the recessed regions comprising a first recessed region and a second recessed region, wherein the first recessed region extends along the substrate in a first direction and the second recessed region extends along the substrate in a second direction crossing the first direction.

2. The substrate as claimed in claim 1, wherein the substrate is a sapphire substrate.

3. The substrate as claimed in claim 1, wherein the bottom surface is a flat surface.

4. The substrate as claimed in claim 1, wherein the recessed regions surrounding each of the protrusion patterns are symmetrical with respect to the relevant protrusion pattern.

5. The substrate as claimed in claim 1, wherein sidewalls of the recessed regions are formed into inclined surfaces.

6. A light emitting diode, comprising:
   a patterned substrate having a top surface, a bottom surface, protrusion patterns arranged in the top surface, and recessed regions surrounding the protrusion patterns and having irregular bottoms in the top surface;
   a first conductive type semiconductor layer formed on the top surface of the substrate;
   a second conductive type semiconductor layer formed on a region of the first conductive type semiconductor layer; and
   an active layer interposed between the first and second conductive type semiconductor layers,
   the recessed regions comprising a first recessed region and a second recessed region, wherein the first recessed region extends along the substrate in a first direction and the second recessed region extends along the substrate in a second direction crossing the first direction.

7. The light emitting diode as claimed in claim 6, further comprising a buffer layer interposed between the substrate and the first conductive type semiconductor layer.

8. The substrate as claimed in claim 1, wherein each recessed region comprises at least two different depths into the substrate.

9. The substrate as claimed in claim 1, wherein the second direction is substantially perpendicular to the first direction.

10. The substrate as claimed in claim 1, wherein the first recessed region comprises a first depth into the substrate and a second depth into the substrate, and the second recessed region comprises a first depth into the substrate and a third depth into the substrate.

11. The substrate as claimed in claim 10, wherein the protrusion patterns are each surrounded by the first depth, the second depth, and the third depth.

12. The light emitting diode of claim 6, wherein protrusion patterns do not directly contact the first conductive type semiconductor layer.

13. The light emitting diode of claim 6, further comprising a layer completely disposed between the protrusion patterns and the first conductive type semiconductor layer.

14. The light emitting diode of claim 6, wherein each recessed region comprises at least two different depths into the substrate.

15. The substrate as claimed in claim 10, wherein the first depth of the first recessed region and the first depth of the second recessed region are different.

16. The substrate as claimed in claim 6, wherein the second direction is substantially perpendicular to the first direction.

17. The substrate as claimed in claim 6, wherein the first recessed region comprises a first depth into the substrate and a second depth into the substrate, and the second recessed region comprises the first depth into the substrate and a third depth into the substrate.

18. A patterned substrate for a light emitting diode, comprising:
   a top surface;
   a bottom surface;
   protrusion patterns arranged in the top surface; and
   recessed regions surrounding the protrusion patterns and having irregular bottoms in the top surface,
   wherein the recessed regions comprise a first recessed region and a second recessed region,
   wherein the first recessed region extends along the substrate in a first direction and the second recessed region extends along the substrate in a second direction crossing the first direction, and
   wherein each recessed region comprises at least two different depths into the substrate.

19. A light emitting diode, comprising:
   a patterned substrate having a top surface, a bottom surface, protrusion patterns arranged in the top surface, and recessed regions surrounding the protrusion patterns and having irregular bottoms in the top surface;
a first conductive type semiconductor layer formed on the top surface of the substrate;
a second conductive type semiconductor layer formed on a region of the first conductive type semiconductor layer; and
an active layer interposed between the first and second conductive type semiconductor layers,
wherein the recessed regions comprise a first recessed region and a second recessed region,
wherein the first recessed region extends along the substrate in a first direction and the second recessed region extends along the substrate in a second direction crossing the first direction, and
wherein each recessed region comprises at least two different depths into the substrate.

* * * * *